(12) United States Patent
Chu et al.

(10) Patent No.: US 9,337,026 B2
(45) Date of Patent: May 10, 2016

(54) GRAPHENE GROWTH ON A CARBON-CONTAINING SEMICONDUCTOR LAYER

(75) Inventors: Jack O. Chu, Manhasset Hills, NY (US); Christos D. Dimitrakopoulos, Somers, NY (US); Alfred Grill, White Plains, NY (US); Chun-yung Sung, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 361 days.

(21) Appl. No.: 13/443,003

(22) Filed: Apr. 10, 2012

(65) Prior Publication Data
US 2012/0193603 A1 Aug. 2, 2012

Related U.S. Application Data

(62) Division of application No. 12/546,034, filed on Aug. 24, 2009, now Pat. No. 8,187,955.

(51) Int. Cl.
*H01L 21/02* (2006.01)
*B82Y 30/00* (2011.01)
*B82Y 40/00* (2011.01)
*C01B 31/04* (2006.01)

(52) U.S. Cl.
CPC ........... *H01L 21/02527* (2013.01); *B82Y 30/00* (2013.01); *B82Y 40/00* (2013.01); *C01B 31/0446* (2013.01); *H01L 21/0245* (2013.01); *H01L 21/02381* (2013.01); *H01L 21/02447* (2013.01); *H01L 21/02664* (2013.01); *H01L 21/02667* (2013.01); *C01B 2204/04* (2013.01); *H01L 21/0262* (2013.01); *Y10T 428/265* (2015.01)

(58) Field of Classification Search
CPC ............ H01L 29/1606; H01L 29/7781; H01L 29/78684; H01L 21/02527; H01L 21/02612; H01L 2924/0002; H01L 2924/00; H01L 51/0048
See application file for complete search history.

(56) References Cited

U.S. PATENT DOCUMENTS

| | | | |
|---|---|---|---|
| 2003/0203599 A1 | 10/2003 | Kanzawa et al. | |
| 2009/0020764 A1* | 1/2009 | Anderson et al. | 257/77 |
| 2009/0181502 A1* | 7/2009 | Parikh et al. | 438/164 |
| 2010/0065988 A1 | 3/2010 | Hannon et al. | |

OTHER PUBLICATIONS

Berger et al., "Ultrathin Epitaxial Graphite: 2D Electron Gas Properties and a Route toward Graphene-based Nanoelectronics" J. Phys. Chem. B (Oct. 2004) pp. 19912-19916, vol. 108.
Gupta et al., "Raman Scattering from High-Frequency Phonons in Supported n-Graphene Layer Films" Nano Letters (Jun. 2006) pp. 2667-2673, vol. 6, No. 12.
Martin-Gago et al., "Electron loss spectroscopy study of the growth by laser ablation of ultra-thin diamond-like films on Si(100)" Surface Science Letters (Jan. 1992) pp. L17-L23, vol. 260, No. 1-3.

* cited by examiner

*Primary Examiner* — Tony Tran
(74) *Attorney, Agent, or Firm* — Scully, Scott, Murphy & Presser, P.C.

(57) ABSTRACT

A semiconductor-carbon alloy layer is formed on the surface of a semiconductor substrate, which may be a commercially available semiconductor substrate such as a silicon substrate. The semiconductor-carbon alloy layer is converted into at least one graphene layer during a high temperature anneal, during which the semiconductor material on the surface of the semiconductor-carbon alloy layer is evaporated selective to the carbon atoms. As the semiconductor atoms are selectively removed and the carbon concentration on the surface of the semiconductor-carbon alloy layer increases, the remaining carbon atoms in the top layers of the semiconductor-carbon alloy layer coalesce to form a graphene layer having at least one graphene monolayer. Thus, a graphene layer may be provided on a commercially available semiconductor substrate having a diameter of 200 mm or 300 mm.

9 Claims, 4 Drawing Sheets

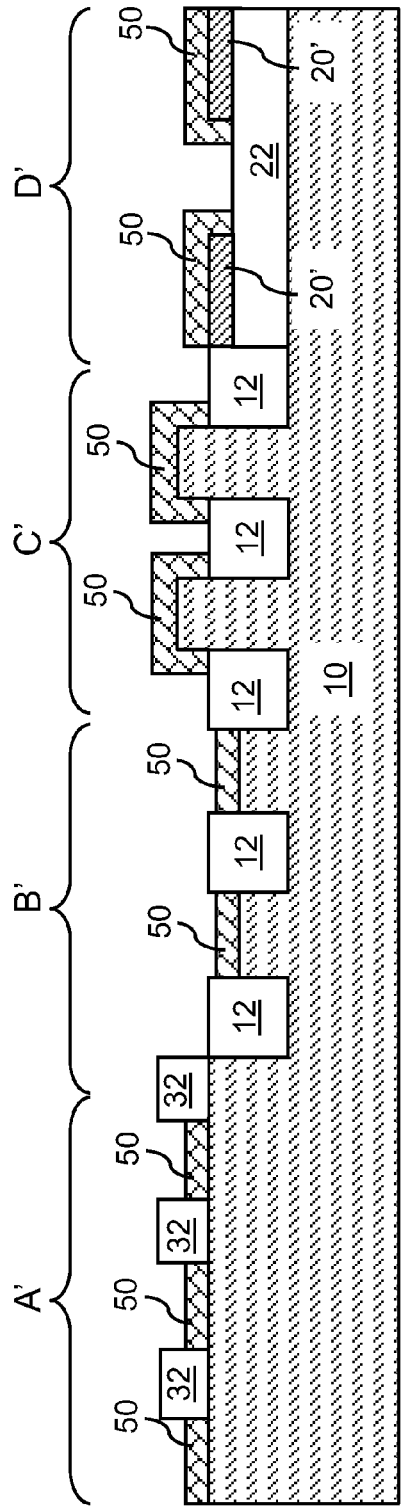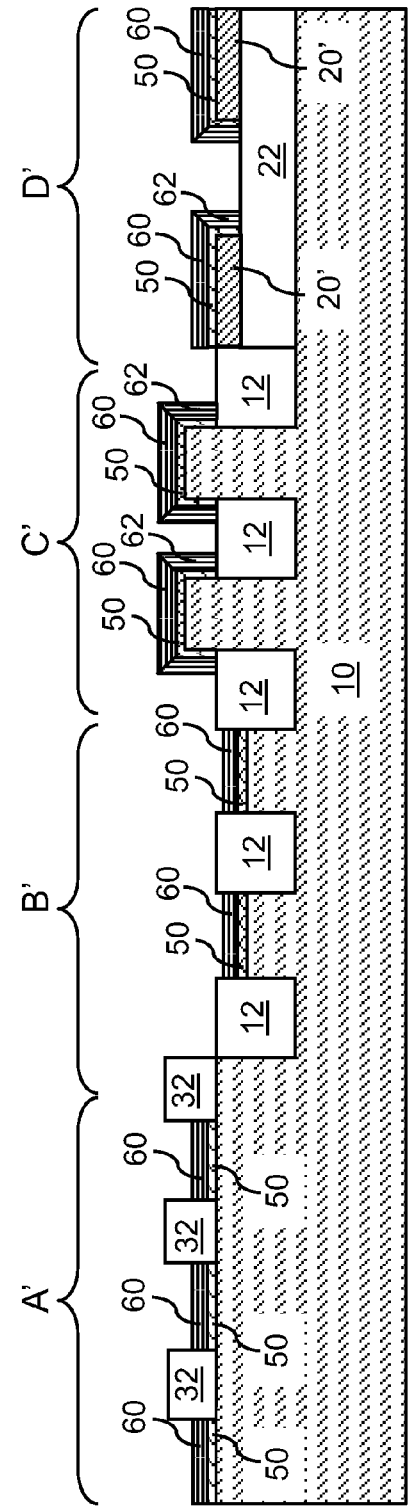

GRAPHENE GROWTH ON A CARBON-CONTAINING SEMICONDUCTOR LAYER

CROSS REFERENCE TO RELATED APPLICATION

This application is a divisional of U.S. patent application Ser. No. 12/546,034, filed Aug. 24, 2009 the entire content and disclosure of which is incorporated herein by reference.

BACKGROUND

The present invention relates to a method of forming a graphene layer on a carbon-containing semiconductor layer, and a structure obtained by the same.

Graphene is a monolayer of a two-dimensional sheet of carbon atoms. A graphene layer has a thickness of about 0.34 nm, i.e., which is approximately the atomic diameter of a single carbon atom. Graphene provides excellent in-plane conductivity. Semiconductor devices employing graphene have been suggested in the art to provide high-density and high-switching-speed semiconductor circuits.

To enable mass manufacturing of such semiconductor devices, it is desirable to grow graphene on commercially available 200 mm or 300 mm semiconductor substrates for compatibility with manufacturing at modern microelectronic fabrication facilities. While it is known that a graphene layer may be grown by direct epitaxial deposition of carbon atoms on, i.e., addition of carbon atoms onto the surface of, a single crystalline silicon carbide (SiC) substrate having a (0001) surface orientation, such silicon carbide substrates are not commercially available at a diameter greater than 4 (or 5) inches at the present time. Such unavailability of silicon carbide (SiC) substrates currently makes it impossible to provide a 200 mm substrate or a 300 mm substrate containing a graphene layer.

Prior attempts to grow a single crystalline silicon carbide layer on a single crystalline silicon substrate have been unsuccessful because of the large lattice mismatch between a silicon crystal and a silicon carbide crystal. In other words, the epitaxial strain of the silicon carbide layer was high enough to destroy the single crystalline alignment between the underlying silicon crystal and the deposited silicon carbide layer such that the deposited silicon carbide layer is rendered polycrystalline. That is, the high stress that exists due to lattice mismatch between the silicon and silicon carbide lattices produces polycrystalline non-commensurate growth of silicon carbide on silicon. Attempts to grow a graphene layer by epitaxial deposition of carbon on such a polycrystalline silicon carbide layer is futile because formation of a graphene layer by epitaxial growth of carbon requires a single crystalline (0001) silicon carbide surface.

BRIEF SUMMARY

The present invention provides a method of forming a graphene layer. In the inventive method, a semiconductor-carbon alloy layer is formed on the surface of a semiconductor substrate, which may be a commercially available semiconductor substrate such as a silicon substrate. The semiconductor-carbon alloy layer is converted into at least one graphene layer during a high temperature anneal, during which the semiconductor material on the surface of the semiconductor-carbon alloy layer is evaporated selective to the carbon atoms. As the semiconductor atoms are selectively removed and the carbon concentration on the surface of the semiconductor-carbon alloy layer increases, the remaining carbon atoms in the top layers of the semiconductor-carbon alloy layer coalesce to form a graphene layer having at least one graphene monolayer. Thus, a graphene layer may be provided on a commercially available semiconductor substrate having a diameter of 200 mm or 300 mm.

According to an aspect of the present invention, a method of forming a graphene layer including at least one graphene monolayer is provided. The method includes: forming a semiconductor-carbon alloy layer on a semiconductor substrate; converting the semiconductor-carbon alloy layer into a semiconductor carbide layer by a first anneal; and converting an exposed top portion of the semiconductor carbide layer into a graphene layer including at least one graphene monolayer by a second anneal.

According to another aspect of the present invention, another method of forming a graphene layer including at least one graphene monolayer is provided. The method includes: providing a semiconductor substrate having at least one semiconductor surface and at least one dielectric surface on a top side; forming a semiconductor-carbon alloy layer selectively on the at least one semiconductor surface, wherein nucleation and growth of a semiconductor-carbon alloy material is suppressed on the at least one dielectric surface; converting the semiconductor-carbon alloy layer into a semiconductor carbide layer by a first anneal; and converting an exposed top portion of the semiconductor carbide layer into a graphene layer including at least one graphene monolayer by a second anneal, wherein the at least one dielectric surface remains exposed.

According to yet another aspect of the present invention, a semiconductor structure is provided, which includes: a semiconductor substrate comprising a single crystalline silicon-containing semiconductor material; a semiconductor carbide layer located on the semiconductor substrate and having a thickness less than 10 nm; and a graphene layer consisting of a number of graphene monolayers and abutting the semiconductor carbide layer, wherein the number is equal to or greater than 1 and equal to or less than 4, and wherein the graphene layer has a (0001) crystalline orientation along a surface normal of a top surface of the semiconductor substrate.

According to still another aspect of the present invention, another semiconductor structure is provided, which includes: a semiconductor substrate comprising a single crystalline silicon-containing semiconductor material; a semiconductor carbide layer abutting a single crystalline silicon-containing semiconductor material and having a thickness less than 10 nm; a dielectric material portion located directly on or directly underneath a top surface of the semiconductor substrate and having a dielectric top surface, wherein the dielectric top surface is exposed within a peripheral area of the dielectric top surface; and a graphene layer consisting of a number of graphene monolayers and abutting the semiconductor carbide layer, wherein the number is equal to or greater than 1 and equal to or less than 4, and wherein the graphene layer has a (0001) crystalline orientation along a surface normal of a top surface of the semiconductor substrate.

BRIEF DESCRIPTION OF THE SEVERAL VIEWS OF THE DRAWINGS

FIG. 7 is a vertical cross-sectional view of the second exemplary semiconductor structure after conversion of the at least one semiconductor-carbon alloy layer into at least one semiconductor carbide layer through a first anneal according to the second embodiment of the present invention.

FIG. 8 is a vertical cross-sectional view of the second exemplary semiconductor structure after conversion of top portions of the at least one semiconductor carbide layer into at least one graphene layer through a second anneal according to the second embodiment of the present invention.

DETAILED DESCRIPTION

Figure 1:
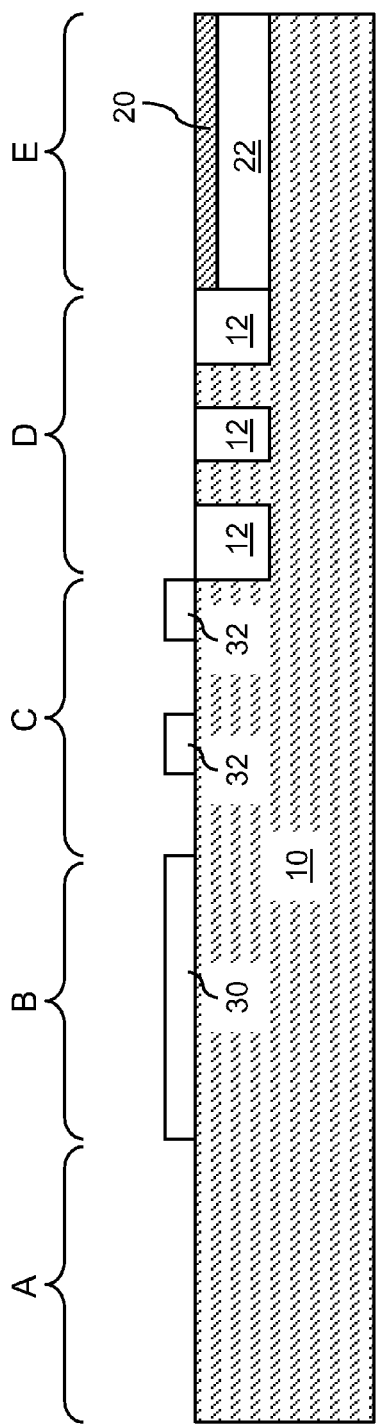
FIG. 1 is a vertical cross-sectional view of a first exemplary semiconductor structure prior to deposition of a semiconductor-carbon alloy layer according to a first embodiment of the present invention.

As stated above, the present invention relates to a method of forming a graphene layer on a carbon-containing semiconductor layer, and a structure obtained by the same, which are now described in detail with accompanying figures. It is noted that like and corresponding elements are referred to by like reference numerals. The drawings are not in scale.

Referring to FIG. 1, a semiconductor structure according to a first embodiment of the present invention is shown. The semiconductor substrate 10 includes a semiconductor material including silicon. The semiconductor substrate 10 may be a commercially available semiconductor substrate having a diameter from 150 mm to 300 mm, and preferably from 200 mm to 300 mm, and having a thickness from 500 micron to 1.0 mm. Preferably, the semiconductor substrate 10 is a single crystalline silicon-containing-semiconductor substrate, i.e., a single crystalline substrate containing silicon or a silicon alloy. The singe crystalline silicon-containing semiconductor substrate may include a single crystalline silicon material, a single crystalline silicon-germanium alloy material, a single crystalline silicon-carbon alloy material, or a single crystalline silicon-germanium-carbon alloy material. If the semiconductor substrate 10 is a single crystalline silicon-containing-semiconductor substrate, the semiconductor substrate 10 may have any arbitrary crystallographic orientation. The semiconductor substrate 10 may be a bulk substrate, a semiconductor-on-insulator (SOI) substrate including a top semiconductor layer having a singe crystalline silicon-containing semiconductor material, or a hybrid substrate having a bulk portion and an SOI portion.

For the purpose of description of the present invention, the semiconductor substrate 10 includes a first region A having a planar exposed top surface of the semiconductor substrate 10, a second region B having an overlying dielectric material portion 30 that is located over the top surface of the semiconductor substrate 10, a third region C having patterned overlying dielectric material portions 32 that are located over the top surface of the semiconductor substrate 10, a fourth region D having exposed semiconductor surfaces of the semiconductor substrate 10 located between embedded dielectric material portions 12, and a fifth region D having a buried insulator layer 22 and a top semiconductor layer 20 having a single crystalline silicon-containing-semiconductor material. The overlying dielectric material portion 30 may be a silicon oxide layer, a silicon nitride layer, or a combination thereof. The patterned overlying dielectric material portions 32 may be portions of a silicon oxide layer, a silicon nitride layer, or a combination thereof. The embedded dielectric material portions 12 may be shallow trench isolation (STI) structures including a dielectric material such as silicon oxide or silicon oxynitride. The fifth region E may be an extremely thin semiconductor-on-insulator (ETSOI) structure in which the thickness of the top semiconductor layer 20 is less than 5 nm. Such extremely thin thicknesses for the top semiconductor layer 20 may be obtained by gas cluster ion beam (GCIB) etching or by multiple cycles of thermal oxidation followed by selective wet etching of the thermal oxide, which in turn reduces the initial thickness of a top semiconductor to a thickness less than 5 nm. The first region A, the second region B, the third region C, the fourth region D, and the fifth region E do not constitute an exhaustive list of surfaces on which the present invention may be practiced. The present invention may be practiced on a semiconductor substrate 10 including any combination of the first region A, the second region B, the third region C, the fourth region D, the fifth region E, and any derivatives therefrom including regions shown in FIG. 5 for a second embodiment of the present invention.

Figure 2:
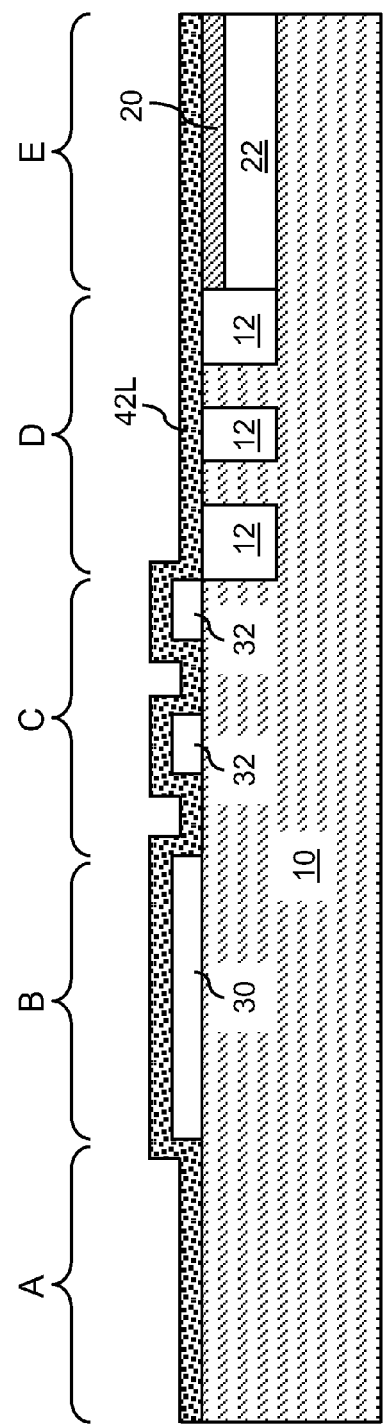
FIG. 2 is a vertical cross-sectional view of the first exemplary semiconductor structure after deposition of a semiconductor-carbon alloy layer according to the first embodiment of the present invention.

Referring to FIG. 2, a semiconductor-carbon alloy layer 42L is formed on the semiconductor substrate 10. The semiconductor-carbon alloy layer 42L may be formed contiguously throughout the entirety of the exposed surfaces of the semiconductor substrate 10, the overlying dielectric material portion 30, the patterned overlying dielectric material portions 32, the embedded dielectric material portions 12, and the top semiconductor layer 20. In general, the semiconductor-carbon alloy layer 42L is formed on at least one of a single-crystalline semiconductor surface of the semiconductor substrate 10 as in the first region A, a dielectric surface located on a top surface of the semiconductor substrate 10 as shown in the second region B, a semiconductor mesa structure (not shown in FIG. 2, see region C' in FIG. 6) protruding on a top surface of the semiconductor substrate 10, a recessed semiconductor surface (not shown in FIG. 2, see region B' in FIG. 6) that is recessed from a top surface of the semiconductor substrate 10, and a top semiconductor layer 20 of an extremely thin semiconductor-on-insulator (ETSOI) structure as shown in the fifth region E.

In a first illustrative example, the semiconductor-carbon alloy layer 42L is a layer of a silicon-carbon alloy. Carbon has an atomic concentration from 20% to 75% in the silicon-carbon alloy, and preferably has an atomic composition from 45% to 55% in the silicon-carbon alloy.

In a second illustrative example, the semiconductor-carbon alloy layer 42L is a layer of a silicon-germanium-carbon alloy. Carbon has an atomic concentration from 20% to 75% in the silicon-germanium-carbon alloy, and preferably has an atomic composition from 45% to 55% in the silicon-germanium-carbon alloy.

In a third illustrative example, the semiconductor-carbon alloy layer 42L is a layer of a germanium-carbon alloy. Carbon has an atomic concentration from 20% to 75% in the germanium-carbon alloy, and preferably has an atomic composition from 45% to 55% in the germanium-carbon alloy.

In a fourth illustrative example, the semiconductor-carbon alloy layer 42L is a superlattice including multiple repetitions of a first material layer and a second material layer. At least one of the first material layer and a second material layer includes carbon and at least one of the first material layer and a second material layer includes at least one of silicon and germanium. The first material layer may include silicon, germanium, or an alloy of silicon and the second material layer may include carbon or a carbon alloy. An exemplary combination of the first material layer and the second material layer is a silicon layer and a carbon layer. Another exemplary combination of the first material layer is a silicon boride layer and a carbon layer.

The semiconductor-carbon alloy layer 42L may be deposited by chemical vapor deposition (CVD), molecular beam epitaxy (MBE), or vacuum evaporation at a temperature from 400° C. to 1,000° C. Typically, the semiconductor-carbon alloy layer 42L is amorphous as deposited when deposited at a temperature less than 1,200° C.

Typically, only a thin layer is required for the semiconductor-carbon alloy layer 42L of the present invention. Specifically, a semiconductor-carbon alloy layer 42L having a thickness from 0.5 nm to 10 nm suffices for the purposes of the present invention. Preferably the thickness range of the semiconductor-carbon alloy layer 42L is from 1.0 nm to 3 nm.

In a first variation of the first embodiment of the present invention, an optional step of introducing structural damages to the exposed portions of the semiconductor-carbon alloy layer 42L may be performed. The exposed top portion of the semiconductor-carbon alloy layer may be structurally damaged by at least one of low energy ion implantation, plasma treatment, gas cluster ion beam treatment, and a reactive ion etch. Such introduction of structural damages to the top surface of the semiconductor-carbon alloy layer 42L induces "damage gettering of carbon" during a first anneal to be subsequently performed. In other words, the movement of carbon atoms to the exposed top portion of the semiconductor-carbon alloy layer 42L is accelerated by the structural damage to the top surface of the semiconductor-carbon alloy layer 42L during the first anneal at an elevated temperature.

In a second variation of the first embodiment of the present invention, another method of accelerating diffusion of carbon toward the semiconductor-carbon alloy layer 42L may be employed. In this variation, a thin metal capping layer (not shown) having a thickness from 0.5 nm to 5 nm is formed directly on the semiconductor-carbon alloy layer 42L. For example, the thin metal capping layer may comprise at least one of Ni, Fe, or Mo. An anneal at a relatively low temperature from 300° C. to 600° C., and preferably from 400° C. to 500° C., is performed. Carbon atoms are preferentially segregated within the semiconductor-carbon alloy layer 42L toward an interface between the metal capping layer and the semiconductor-carbon alloy layer 42L during this anneal. After the carbon atoms are segregated toward the interface, the metal capping layer may be removed selective to the semiconductor-carbon alloy layer 42L.

Figure 3:
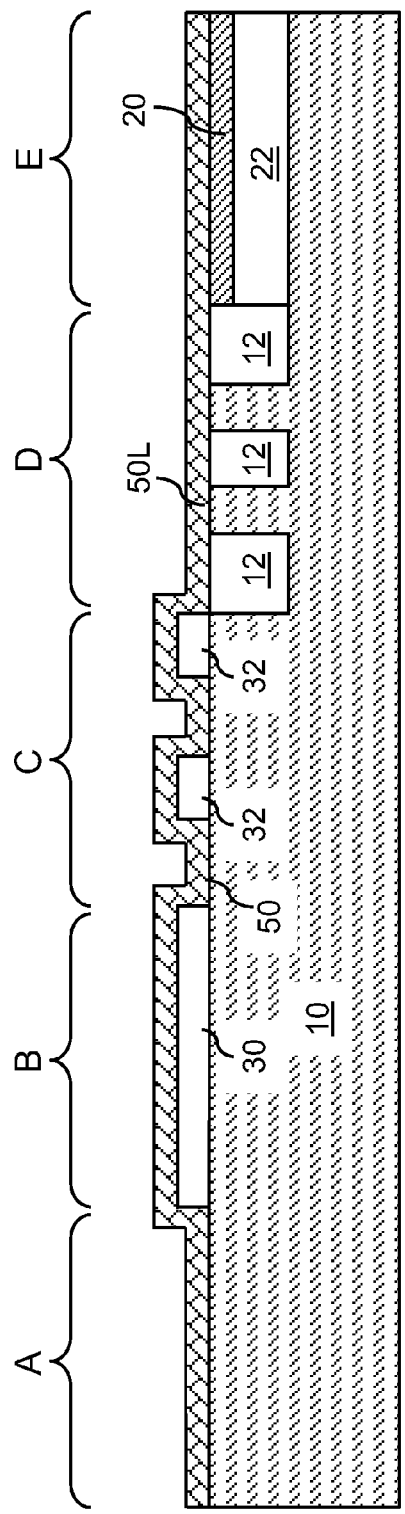
FIG. 3 is a vertical cross-sectional view of the first exemplary semiconductor structure after conversion of the semiconductor-carbon alloy layer into at least one semiconductor carbide layer through a first anneal according to the first embodiment of the present invention.

Referring to FIG. 3, a first anneal is performed at an elevated temperature that is sufficiently high to convert the entirety of the semiconductor-carbon alloy layer 42L into a semiconductor carbide layer 50L. The temperature of the first anneal is typically from 1,000° C. to 1,200° C. The entirety of the semiconductor carbide layer 50L is single crystalline by manipulation of the process employed for the first anneal.

In case the entirety of the semiconductor-carbon alloy layer 42L is formed directly on (a) semiconductor surface(s) of the semiconductor substrate 10, limiting the thickness of the semiconductor-carbon alloy layer 42L allows the elastic accommodation of stress by the semiconductor carbide layer 50L from the underlying semiconductor substrate 10. In this case, a commensurate single crystalline semiconductor carbide growth mode directly on the semiconductor crystal of the semiconductor substrate 10 is maintained. In other words, as the semiconductor-carbon alloy layer 42L is crystallized, the semiconductor carbide structure of the semiconductor carbide layer 50L is epitaxially aligned to the underlying single crystalline structure of the semiconductor substrate 10. The present invention does not employ any intermediate buffer layer that accommodates the lattice mismatch between the top surface of the single crystalline semiconductor substrate and the semiconductor carbide layer 50L. Thus, accommodation of stress occurs by plastic deformation in the semiconductor carbide layer 50L. Increasing the thickness of the semiconductor carbide layer 50L results in formation of defects such as dislocations, grain boundaries, stacking faults, voids, and other structural defects. This in general results to fine crystalline non-commensurate semiconductor carbide overgrowth. Therefore, maintaining the thickness of the semiconductor-carbon alloy layer 42L within an "ultrathin" range, i.e., a thickness less than 10 nm is preferred in the present invention.

In case any portion of the semiconductor-carbon alloy layer 42L is formed directly on at least one dielectric material portion such as the overlying dielectric material portion 30, the patterned overlying dielectric material portions 32, and the embedded dielectric material portions 12, the lack of atomic epitaxial registry with an underlying single crystalline semiconductor material tends to produce a polycrystalline silicon carbide film during the first anneal of the semiconductor-carbon alloy layer 42. To compensate for such propensity to form polycrystalline structures and to insure that the semiconductor-carbon alloy layer 42L is formed as a single crystalline layer, a first anneal that induces formation of a large grain size is employed in the present invention. If any portion of the semiconductor-carbon alloy layer 42L is formed directly on (a) semiconductor surface(s) of the semiconductor substrate 10, the atomic registry of the portion of the semiconductor-carbon alloy layer 42L directly on such a semiconductor surface is propagated over to another portion of the semiconductor-carbon alloy layer 42L over dielectric material portions by the first anneal of the present invention.

The first anneal is performed at a temperature greater a deposition temperature of the semiconductor-carbon alloy layer 42L. The first anneal may be effected by a furnace anneal at a uniform temperature, which is effective if the entirety of the semiconductor-carbon alloy layer 42L is formed directly on (a) semiconductor surface(s) of the semiconductor substrate 10.

Alternately, the first anneal may be effected by a scanned laser anneal, which has the capability to allow lateral growth of a crystalline structure for the semiconductor carbide layer 50L and may be employed for the case of a semiconductor-carbon alloy layer 42L that is formed directly on at least one dielectric material portion (30, 32, 12) as well as for the case of a semiconductor-carbon alloy layer 42L that is formed directly on (a) semiconductor surface(s) of the semiconductor substrate 10. The lateral scanning of the scanned laser anneal enable not only growth of a large single crystalline structure within the semiconductor carbide layer 50L but also extension of the epitaxial alignment of the portion of the semiconductor carbide layer 50L directly on the single crystalline material of the semiconductor substrate 10 into the portion of the semiconductor carbide layer 50L that is formed over the at least one dielectric material portion (30, 32, 12) so that the entirety of the semiconductor carbide layer 50L becomes single crystalline.

Yet alternately, the first anneal may be effected by a furnace anneal in which a non-uniform temperature gradient is provided across the semiconductor substrate 10. A local maximum temperature region on the semiconductor substrate moves continuously from one side of the semiconductor substrate 10 to an opposite side of the semiconductor substrate 10 so that the moving local maximum temperature region encompasses the entirety of the area of the semiconductor substrate 10 at least once. Such moving of the local maximum temperature region has a similar effect as the scanned laser anneal in that growth of a large single crystalline structure within the semiconductor carbide layer 50L is promoted and the epitaxial alignment of the portion of the semiconductor carbide layer 50L directly on the single crystalline material of the semiconductor substrate 10 is extended into the portion of the semiconductor carbide layer 50L that is formed over the various dielectric material portions (30, 32, 12). Thus, the entirety of the semiconductor carbide layer 50L becomes single crystalline.

In the first illustrative example, the semiconductor-carbon alloy layer 42L is a layer of a silicon-carbon alloy, and the semiconductor carbide layer 50L is a silicon carbide (SiC) layer after the first anneal.

In the second illustrative example, the semiconductor-carbon alloy layer 42L is a layer of a silicon-germanium-carbon alloy, and the semiconductor carbide layer 50L is a silicon-germanium carbide ($Si_xGe_{1-x}C$) layer after the first anneal. The value of x is from 0 to 1.

In the third illustrative example, the semiconductor-carbon alloy layer 42L is a layer of a germanium-carbon alloy, and the semiconductor carbide layer 50L is a germanium carbide (GeC) layer after the first anneal.

In the fourth illustrative example, the semiconductor-carbon alloy layer 42L is a superlattice of the first material layer and the second material layer, and the semiconductor carbide layer 50L is a semiconductor-carbide layer after the first anneal. In this example, the semiconductor-carbide layer includes the semiconductor material(s) of the first material layer and the second material layer.

Figure 4:
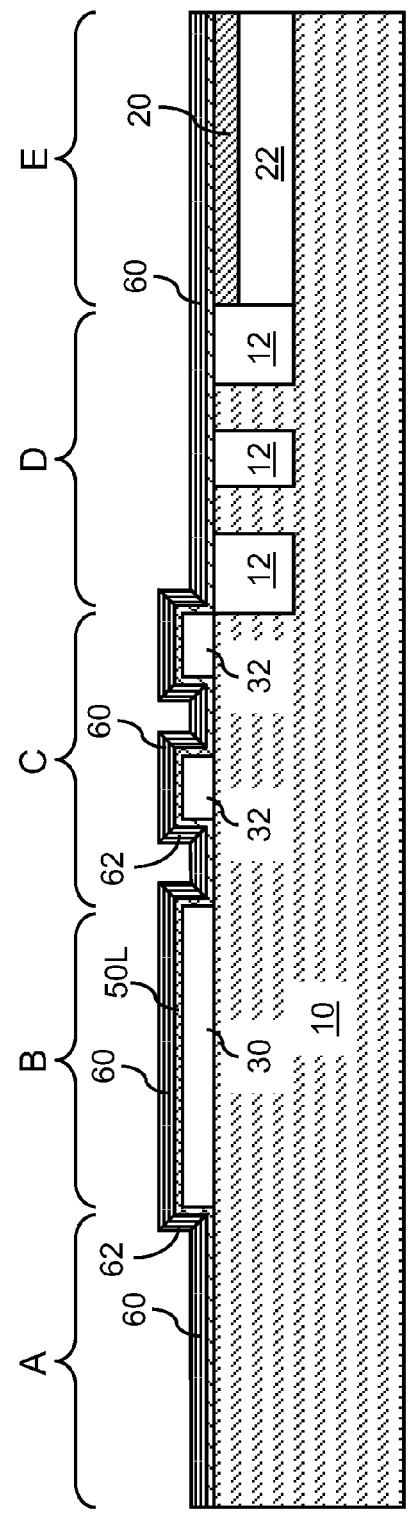
FIG. 4 is a vertical cross-sectional view of the first exemplary semiconductor structure after conversion of top portions of the at least one semiconductor carbide layer into at least one graphene layer through a second anneal according to the first embodiment of the present invention.

Referring to FIG. 4, a second anneal at a temperature greater than the temperature of the first anneal is performed. The temperature of the second anneal is greater than 1,200° C., and may be greater than 1,300° C. The temperature of the second anneal is lower than the melting point of the semiconductor substrate 10. Semiconductor atoms other than carbon atoms in the semiconductor carbide layer 50L are evaporated from the exposed top portion of the semiconductor carbide layer 50L during the second anneal. The remaining carbon atoms from the upper portion of the semiconductor carbide layer 50L coalesce into at least one graphene layer, which may include at least one horizontal graphene layer 60 and/or at least one non-horizontal graphene layer 62. The lower portions of the semiconductor carbide layer 50L still remain between the at least one graphene layer (60, 62) and the semiconductor substrate 10 and/or the various dielectric material portions (30, 32, 12). The semiconductor carbide layer 50L has a thickness less than 10 nm prior to formation of the at least one horizontal graphene layer 60 and/or at least one non-horizontal graphene layer 62. Consequently, the semiconductor carbide layer 50L has a thickness less than 10 nm after formation of the at least one horizontal graphene layer 60 and/or at least one non-horizontal graphene layer 62.

Each of the at least one horizontal graphene layer 60 consists of a number of graphene monolayers and abuts a horizontal surface the semiconductor carbide layer 50L, which may be contiguous throughout the entirety of the area of the semiconductor substrate 10. The number of graphene monolayers in each of the at least one horizontal graphene layer 60 is equal to or greater than 1 and equal to or less than 4, i.e., may be 1, 2, 3, or 4. Each of the at least one horizontal graphene layer 60 has a surface normal that is parallel to the surface normal of the top surface of the semiconductor substrate 10, i.e., the plane of each monolayer of the at least one horizontal graphene layer 60 is parallel to the top surface and the bottom surface of the semiconductor substrate 10. Consequently, each of the at least one horizontal graphene layer 60 has a (0001) crystalline orientation along the surface normal of a top surface of the semiconductor substrate 10.

Each of the at least one non-horizontal graphene layer 62 consists of a number of graphene monolayers and abuts a sidewall of a portion of the semiconductor carbide layer 50L. The portion of the semiconductor carbide layer 50L may laterally abut a sidewall semiconductor surface (for example, sidewalls of a semiconductor mesa) that is not parallel to the top surface of the semiconductor substrate 10. The number of graphene monolayers in each of the at least one non-horizontal graphene layer 62 is equal to or greater than 1 and equal to or less than 4, i.e., may be 1, 2, 3, or 4. Each of the at least one non-horizontal graphene layer 62 has a surface normal that is not parallel to the surface normal of the top surface of the semiconductor substrate 10. Instead, the plane of each monolayer of the at least one non-horizontal graphene layer 62 is parallel to a sidewall of the semiconductor substrate 10 or a sidewall of the various dielectric material portions (30, 32, 12). Consequently, each of the at least one non-horizontal graphene layer 62 has a (0001) crystalline orientation along the surface normal of the corresponding sidewall of the semiconductor substrate 10 or one of the various dielectric material portions (30, 32, 12).

While the present invention has been described with a first anneal and a second anneal, the first anneal and the second anneal may be performed as two separate anneal processes or may be performed as a single integrated anneal process in which the temperature is changed by ramping or otherwise between the first part that corresponds to the first anneal and the second part that corresponds to the second anneal within the single integrated anneal process. Such variations are explicitly contemplated herein.

Figure 5:
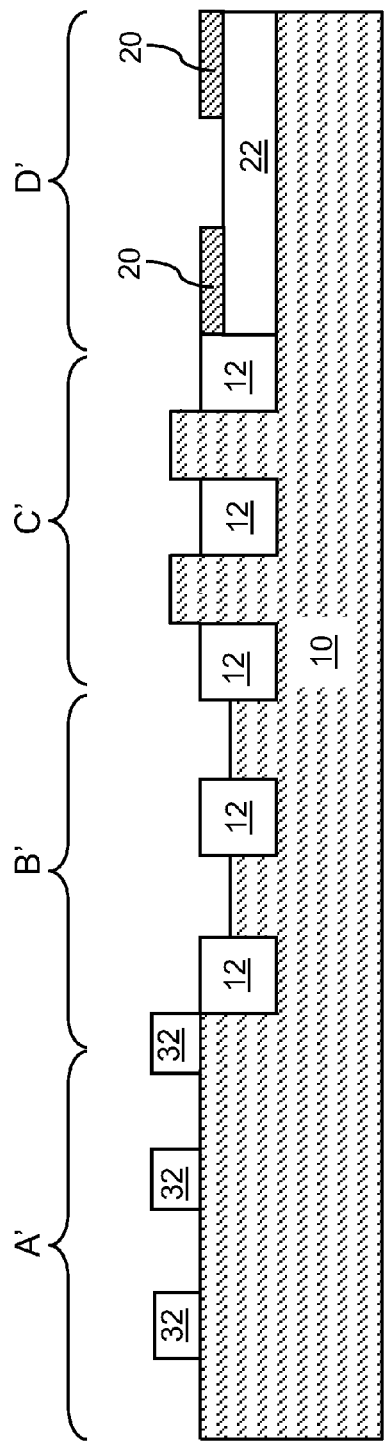
FIG. 5 is a vertical cross-sectional view of a second exemplary semiconductor structure prior to selective deposition of at least one semiconductor-carbon alloy layer according to a second embodiment of the present invention.

Referring to FIG. 5, a semiconductor structure according to a second embodiment of the present invention is shown. The semiconductor substrate 10 may be the same as the semiconductor substrate of the first embodiment of the present invention.

For the purpose of description of the present invention, four regions are shown in the semiconductor substrate 10. The four regions include a first region A' having patterned overlying dielectric material portions 32 that are located over the top surface of the semiconductor substrate 10, a second region B' having recessed semiconductor surfaces located between embedded dielectric material portions 12, a third region C' having semiconductor mesa structures that are raised above top surfaces of embedded dielectric material portions 12, and a fourth region D' having a buried insulator layer 22 and a patterned top semiconductor layer 20' having a single crystalline silicon-containing-semiconductor material. The patterned overlying dielectric material portions 32 may be portions of a silicon oxide layer, a silicon nitride layer, or a combination thereof. The embedded dielectric material portions 12 may be shallow trench isolation (STI) structures including a dielectric material such as silicon oxide or silicon oxynitride. The fourth region D' may be an extremely thin semiconductor-on-insulator (ETSOI) structure in which the thickness of the patterned top semiconductor layer 20' is less than 5 nm. The first region A', the second region B', the third region C', and the fourth region D' do not constitute an exhaustive list of surfaces on which the present invention may be practiced. The present invention may be practiced on a semiconductor substrate 10 including any combination of the first region A', the second region B', the third region C', the fourth region D', and any derivatives therefrom.

Figure 6:
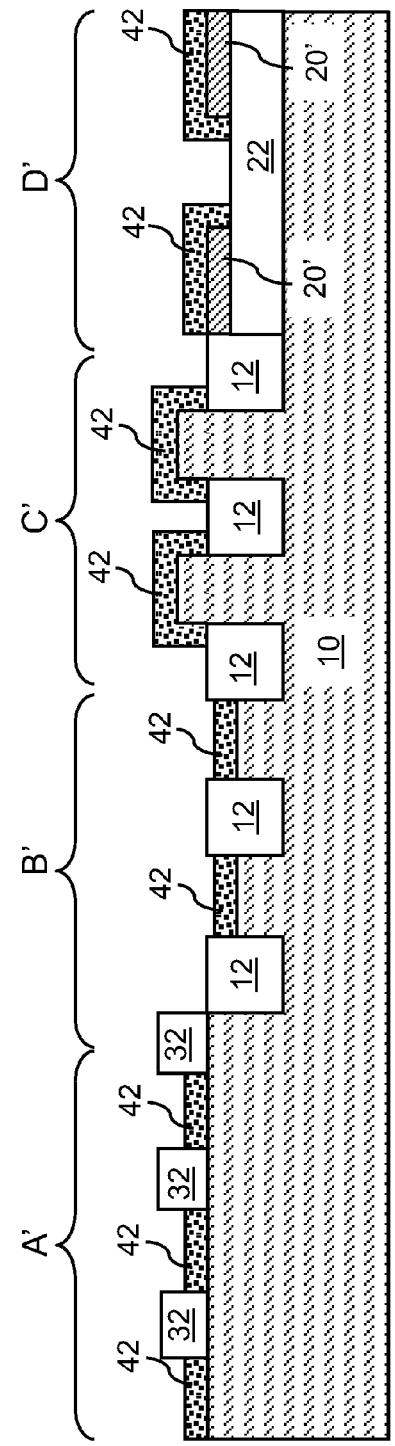
FIG. 6 is a vertical cross-sectional view of the second exemplary semiconductor structure after selective deposition of at least one semiconductor-carbon alloy layer according to the second embodiment of the present invention.

Referring to FIG. 6, semiconductor-carbon alloy layers 42 are selectively formed on the exposed semiconductor surfaces semiconductor substrate 10. Nucleation or deposition of the semiconductor-carbon alloy material is suppressed on the dielectric surfaces of the various dielectric material portions (32, 23, 22), i.e., the patterned overlying dielectric material portions 32, the embedded dielectric material portions 12, and the buried insulator layer 22. If the exposed semiconductor surfaces of the semiconductor substrate 10 are not contiguous across the entirety of the top surface of semiconductor substrate 10, the semiconductor-carbon alloy layers 42 are formed as multiple disjoined layers. If the exposed semiconductor surfaces of the semiconductor substrate 10 are contiguous across the entirety of the top surface of semiconductor substrate 10, the semiconductor-carbon alloy layers 42 are formed as a contiguous layer having a plurality of holes over the area of the various dielectric material portions (32, 23, 22).

The semiconductor-carbon alloy layers 42 may be layers of a silicon-carbon alloy, layers of a silicon-germanium-carbon alloy, layers of a germanium-carbon alloy, or superlattices including multiple repetitions of a first material layer and a second material layer as in the various illustrative examples of the first embodiment. In each case, the composition of the semiconductor-carbon alloy layers 42 may be the same as the semiconductor-carbon alloy layer in the corresponding illustrative example in the first embodiment of the present invention.

Preferably, the semiconductor-carbon alloy layers 42 are deposited by chemical vapor deposition (CVD) at a temperature from 400° C. to 1,000° C. Typically, a first source gas for a semiconductor material, a second source gas for carbon, and an etchant gas are flowed into a reactor concurrently or sequentially. For example, the first source gas for the semiconductor material may be silane ($SiH_4$), disilane ($Si_2H_6$), dichlolosilane ($SiH_2Cl_2$), or trichlorosilane ($SiHCl_3$) if the semiconductor material is silicon. The first source gas for the semiconductor material may be germane ($GeH_4$) or digermane ($Ge_2H_6$) if the semiconductor material is germanium. A source gas for silicon and a source gas for germanium may be mixed or flowed sequentially as the first source gas if the semiconductor material is a silicon germanium alloy. The second source gas for carbon may be acetylene ($C_2H_2$) or ethylene ($C_2H_2$). The etchant gas may be hydrogen chloride (HCl). In some embodiments, the first source gas may provide sufficient etching so that an etchant gas is not necessary. For example, dichlolosilane ($SiH_2Cl_2$) or trichlorosilane ($SiHCl_3$) produces sufficient etching under some deposition conditions of pressure and temperature to obviate the need for the etchant gas.

As discussed above, only a thin layer is required for the semiconductor-carbon alloy layers 42 of the present invention. As in the first embodiment, semiconductor-carbon alloy layers 42 having a thickness from 0.5 nm to 10 nm suffices for the purposes of the present invention. Preferably the thickness range of the semiconductor-carbon alloy layers 42 are from 1.0 nm to 3 nm.

An optional step of introducing structural damages to the exposed portions of the semiconductor-carbon alloy layers 42 may be performed as described in the first embodiment. Further, another method of accelerating diffusion of carbon toward the semiconductor-carbon alloy layers 42 by employing a thin metal capping layer may be optionally employed as described in the first embodiment.

Referring to FIG. 7, a first anneal is performed at an elevated temperature that is sufficiently high to convert the semiconductor-carbon alloy layers 42 into semiconductor carbide layers 50. The temperature of the first anneal is typically from 1,000° C. to 1,200° C. The entirety of each semiconductor carbide layer 50 is single crystalline by manipulation of the process employed for the first anneal.

Each of the semiconductor-carbon alloy layers 42 is formed directly on a semiconductor surface of the semiconductor substrate 10. By limiting the thickness of the semiconductor-carbon alloy layers 42, the stress applied to the semiconductor carbide layers 50 from the underlying semiconductor substrate 10 is elastically accommodated within the semiconductor carbide layers 50. A commensurate single crystalline semiconductor carbide growth mode directly on the semiconductor crystal of the semiconductor substrate 10 is maintained within each semiconductor carbide layer 50. As the semiconductor-carbon alloy layers 42 are crystallized, each semiconductor carbide structure of the semiconductor carbide layers 50 is epitaxially aligned to the underlying single crystalline structure of the semiconductor substrate 10. As discussed in the description of the first embodiment of the present invention, maintaining the thickness of the semiconductor-carbon alloy layers 42 within an "ultrathin" range is preferred in the present invention.

The first anneal is performed at a temperature greater than a deposition temperature of the semiconductor-carbon alloy layers 42. The same anneal method may be employed for the first anneal as in the first embodiment. Specifically, the first anneal may be effected by the same anneal methods as described in the first embodiment of the present invention, i.e., a furnace anneal at a uniform temperature, a scanned laser anneal, or a furnace anneal in which a non-uniform temperature gradient is provided across the semiconductor substrate 10. The temperature of the first anneal is selected to enable complete epitaxial alignment of the semiconductor carbide layers 50 with the single crystalline structure of the semiconductor substrate 10.

In a first illustrative example, the semiconductor-carbon alloy layers 42 may be layers of a silicon-carbon alloy, and the semiconductor carbide layers 50 may be silicon carbide (SiC) layers after the first anneal.

In a second illustrative example, the semiconductor-carbon alloy layers 42 may be layers of a silicon-germanium-carbon alloy, and the semiconductor carbide layers 50 may be silicon-germanium carbide ($Si_xGe_{1-x}C$) layers after the first anneal. The value of x is from 0 to 1.

In the third illustrative example, the semiconductor-carbon alloy layers 42 may be layers of a germanium-carbon alloy, and the semiconductor carbide layers 50 may be germanium carbide (GeC) layers after the first anneal.

In the fourth illustrative example, the semiconductor-carbon alloy layers 42 may be superlattices of the first material layer and the second material layer, and the semiconductor carbide layers 50 may be semiconductor-carbide layers after the first anneal. In this example, the semiconductor-carbide layer includes the semiconductor material(s) of the first material layer and the second material layer.

Referring to FIG. 8, a second anneal at a temperature greater than the temperature of the first anneal is performed. The temperature of the second anneal is greater than 1,200° C., and may be greater than 1,300° C. The temperature of the second anneal is lower than the melting point of the semiconductor substrate 10. Semiconductor atoms other than carbon atoms in the semiconductor carbide layers 50 are evaporated from the exposed top portion of the semiconductor carbide layers 50 during the second anneal. The remaining carbon atoms from the upper portion of the semiconductor carbide layers 50 coalesce into at least one graphene layer, which may include at least one horizontal graphene layer 60 and/or at least one non-horizontal graphene layer 62. The lower portions of the semiconductor carbide layers 50 still remains between the at least one graphene layer (60, 62) and the semiconductor substrate 10. The semiconductor carbide layers 50 have a thickness less than 10 nm prior to formation of the at least one horizontal graphene layer 60 and/or at least one non-horizontal graphene layer 62. Consequently, the semiconductor carbide layers 50 have a thickness less than 10 nm after formation of the at least one horizontal graphene layer 60 and/or at least one non-horizontal graphene layer 62.

Each of the at least one horizontal graphene layer 60 consists of a number of graphene monolayers and abuts a horizontal surface the semiconductor carbide layers 50, which may be contiguous throughout the entirety of the area of the semiconductor substrate 10. The number of graphene monolayers in each of the at least one horizontal graphene layer 60 is equal to or greater than 1 and equal to or less than 4, i.e., may be 1, 2, 3, or 4. Each of the at least one horizontal graphene layer 60 has a surface normal that is parallel to the surface normal of the top surface of the semiconductor substrate 10, i.e., the plane of each monolayer of the at least one horizontal graphene layer 60 is parallel to the top surface and the bottom surface of the semiconductor substrate 10. Consequently, each of the at least one horizontal graphene layer 60 has a (0001) crystalline orientation along the surface normal of a top surface of the semiconductor substrate 10.

Each of the at least one non-horizontal graphene layer 62 consists of a number of graphene monolayers and abuts a sidewall of a semiconductor carbide layer 50. The semiconductor carbide layer 50 may laterally abut a sidewall semiconductor surface (for example, sidewalls of a semiconductor mesa in the third region C') that is not parallel to the top surface of the semiconductor substrate 10. The number of graphene monolayers in each of the at least one non-horizontal graphene layer 62 is equal to or greater than 1 and equal to or less than 4, i.e., may be 1, 2, 3, or 4. Each of the at least one non-horizontal graphene layer 62 has a surface normal that is not parallel to the surface normal of the top surface of the semiconductor substrate 10. Instead, the plane of each monolayer of the at least one non-horizontal graphene layer 62 is parallel to a sidewall of a mesa of the semiconductor substrate 10 or a sidewall of the patterned top semiconductor layer 20'. Consequently, each of the at least one non-horizontal graphene layer 62 has a (0001) crystalline orientation along the surface normal of the corresponding sidewall of the semiconductor substrate 10 or the corresponding sidewall of the patterned top semiconductor layer 22.

As in the first embodiment, the first anneal and the second anneal may be performed as two separate anneal processes or may be performed as a single integrated anneal process in which the temperature is changed by ramping or otherwise between the first part that corresponds to the first anneal and the second part that corresponds to the second anneal within the single integrated anneal process.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor substrate comprising a single crystalline silicon-containing semiconductor material;
   a semiconductor carbide layer abutting single crystalline silicon-containing semiconductor material and having a thickness less than 10 nm;
   a dielectric material portion located directly on or directly underneath a top surface of said semiconductor substrate and having a dielectric top surface, wherein said dielectric material portion is
      an embedded dielectric material portion located between recessed semiconductor surfaces of said semiconductor substrate, wherein an outermost vertical sidewall of said embedded dielectric material portion is in direct contact with an outermost vertical sidewall of said semiconductor carbide layer; and
   a graphene layer consisting of a number of graphene monolayers and abutting said semiconductor carbide layer, wherein said number is equal to or greater than 1 and equal to or less than 4, and wherein said graphene layer has a (0001) crystalline orientation along a surface normal of a top surface of said semiconductor substrate.

2. The semiconductor structure of claim 1, wherein said semiconductor carbide layer is one of a silicon carbide layer, a silicon-germanium carbide layer, and a germanium carbide layer.

3. The semiconductor structure of claim 2, wherein said semiconductor carbide layer is located directly on said single crystalline silicon-containing semiconductor material.

4. The semiconductor structure of claim 3, wherein said semiconductor carbide layer is single crystalline.

5. The semiconductor structure of claim 1, wherein said semiconductor surface includes a sidewall semiconductor surface that is not parallel to said top surface of said semiconductor substrate.

6. The semiconductor structure of claim 5, wherein a portion of said semiconductor carbide layer abuts said sidewall semiconductor surface and another grapheme layer having a (0001) crystalline orientation along a surface normal of said sidewall semiconductor surface.

7. The semiconductor structure of claim 6, wherein said another graphene layer consists of a second number of graphene monolayers, and wherein said second number is equal to or greater than 1 and equal to or less than 4.

8. The semiconductor structure of claim 1, wherein said semiconductor carbide layer has a single crystalline semiconductor carbide structure that is epitaxially aligned to a single crystalline structure of said single crystalline silicon-containing semiconductor material.

9. The semiconductor structure of claim 8, wherein said vertical portion of said semiconductor carbide layer is epitaxially aligned to said single crystalline structure at a sidewall of said single crystalline silicon-containing semiconductor material.

* * * * *